US007752753B2

(12) United States Patent
Pai

(10) Patent No.: US 7,752,753 B2
(45) Date of Patent: Jul. 13, 2010

(54) METHOD FOR MANUFACTURING WATER-PROOF ELECTRONIC DEVICE

(75) Inventor: Chun-Chung Pai, Taipei County (TW)

(73) Assignee: ACA Digital Corporation, Taipei County (TW)

( * ) Notice: Subject to any disclaimer, the term of this patent is extended or adjusted under 35 U.S.C. 154(b) by 215 days.

(21) Appl. No.: 12/138,732

(22) Filed: Jun. 13, 2008

(65) Prior Publication Data

US 2009/0307894 A1 Dec. 17, 2009

(51) Int. Cl.
*H01R 43/00* (2006.01)
*H05K 13/00* (2006.01)

(52) U.S. Cl. .......................... 29/855; 29/592.1; 29/841; 29/858; 29/883; 264/272.11

(58) Field of Classification Search ................ 29/592.1, 29/841, 855, 858, 883; 264/272.11
See application file for complete search history.

(56) References Cited

U.S. PATENT DOCUMENTS 5,860,766 A * 1/1999 Lochtefeld et al. ............ 405/79
6,105,527 A * 8/2000 Lochtefeld et al. .......... 114/125
6,690,360 B2 * 2/2004 Johnston et al. ............. 345/168
6,752,655 B1 * 6/2004 Kaczmarek ................. 439/546

* cited by examiner

*Primary Examiner*—Paul D Kim
(74) *Attorney, Agent, or Firm*—Rosenberg, Klein & Lee

(57) ABSTRACT

A method being applied to manufacture a water-proof electronic device (200, 200*a*) is disclosed in the present invention. In the method, at least one inner component is assembled into at least one water-proof shell to form at least one sub-assembly, which has a first water-proof portion and a water-permeable portion; a injection molding die is fitted around the water-permeable portion; and an injection molding treatment is executed for the injection molding die with the water-permeable portion therein to form a second water-proof portion; and then the injection molding die is removed after a cooling process, so as to manufacture the water-proof electronic device with the first water-proof portion and the second water-proof portion.

16 Claims, 6 Drawing Sheets

METHOD FOR MANUFACTURING WATER-PROOF ELECTRONIC DEVICE

FIELD OF THE INVENTION

The present invention relates to a method for manufacturing an electronic device, and more particularly to a method for manufacturing a water-proof electronic device.

BACKGROUND OF THE INVENTION

In daily life, many electronic components, such as the lighting emitting diodes (LED), the induction coil(s) or circuit(s), the central processing unit (CPU), etc., are applied to be assembled within many electrical or electronic devices. More particular, it is usually necessary to provide proper means of water proof if the electronic devices are designed to be operated under water or a humid environment condition. Generally, the electronic devices designed to be operated under water or a humid environment condition can be defined as water-proof electronic devices.

Under the background, among the most existing water-proof electronic devices, they usually comprises some inner electrical or electronic components, such as processing unit, sensing unit, induction circuit, driver IC, etc., which are not allowable for contacting with water. In General, these inner electrical components are assembled between two shells matched with each other, and then some sealing members, such as flexible seals, glue, tapes, etc., are provided to seal the gap(s) between the mentioned two shells.

In practice, it is still difficult to provide sufficient water-proof function via the sealing members, due to that there are still existing some clearance and holes between the sealing members and the two mentioned shells. Under this condition, once the electronic devices are operated under water or a humid environment condition, water will permeate into the shell and contact to the inner electrical or electronic components, and bring negative influence, such as generating internal short circuit(s) to make the whole electronic device be damaged or broken.

Even, in the some traditional water electronic devices, thermal melted glue may be applied to seal the gap(s) between the two mentioned shells, it is still to difficult to seal the gap(s) homogeneously due to that the thermal melted glue is a semi-fluid when it is heated to be melted. Therefore, generally speaking, it is still difficult to control the reliability of water proof to meet the specified requirements. Moreover, the marks of thermal melted glue will also make the final product of the electronic device present rough appearance.

Based on above description, the inventor is of the opinion that it is necessary to develop a new method to manufacture a new water-proof electronic device, in which the mentioned inner electrical and electronic components can be well package to resist water permeating, so as to prevent they from contacting with water when the electronic device is operated under water or the humid environment condition.

SUMMARY OF THE INVENTION

Due to that the traditional water-proof electronic device provided in prior arts cannot solve the problems as mentioned, i.e., the difficulty of well sealing and the problem of presenting rough appearance; a primary objective of the present invention provides a method to manufacture a water-proof electronic device by assembling the inner components, especially the inner electrical or electronic components, into at least one shell to form a sub-assembly, and then executing an injection molding treatment on a part of the outer surface of the sub-assembly to make the inner components be well packaged.

Means of the present invention for solving the problems as mentioned above a method being applied to manufacture a water-proof electronic device is disclosed in the present invention. In the method, at least one inner component are assembled into at least one water-proof shell to form at least one sub-assembly, which has a first water-proof portion and a water-permeable portion; a injection molding die is fitted around the water-permeable portion; and an injection molding treatment is executed for the injection molding die with the water-permeable portion therein to form a second water-proof portion; and then the injection molding die is removed after a cooling process, so as to manufacture the water-proof electronic device with the first water-proof portion and the second water-proof portion.

Except for the means for providing the function of water proof, some outer components can be further assembled to the water-proof electronic device to provide additional function (s). For example, it the preferred embodiment of the present invention, the water-proof electronic device is a radio frequency identification (RFID) sensing unit, the first water-proof portion is a gripping handle, and some impact-resistance members (served as the outer components), can be further assembled to the gripping handle to provide the additional function of impact-resistance.

Comparing with the traditional water-proof electronic device as disclosed in prior arts, in the present invention, the inner components, especially the inner electrical and electronic components, are assembled within the water-permeable portion of the sub-assembly, and the water-permeable portion is further integrally packaged via the injection molding treatment to form the second water-proof portion; therefore, there will be no gap on the second water-proof portion any more, so that the inner components can be well packaged to prevent from contacting with water when the water-proof electronic device is operated under water or the humid environment condition.

The devices, steps of the method, characteristics, and the preferred embodiment of this invention are described with relative figures as follows.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The method as provided in accordance with the present invention can be widely applied to manufacture many kinds of water-proof electronic devices. Obviously, the combined applications of the present invention are too numerous to be enumerated and described, so that only one preferred embodiment applied to manufacture a water-proof RFID sensing device, a kind of the water-proof electronic devices, is disclosed as follows for representation.

Figure 1:
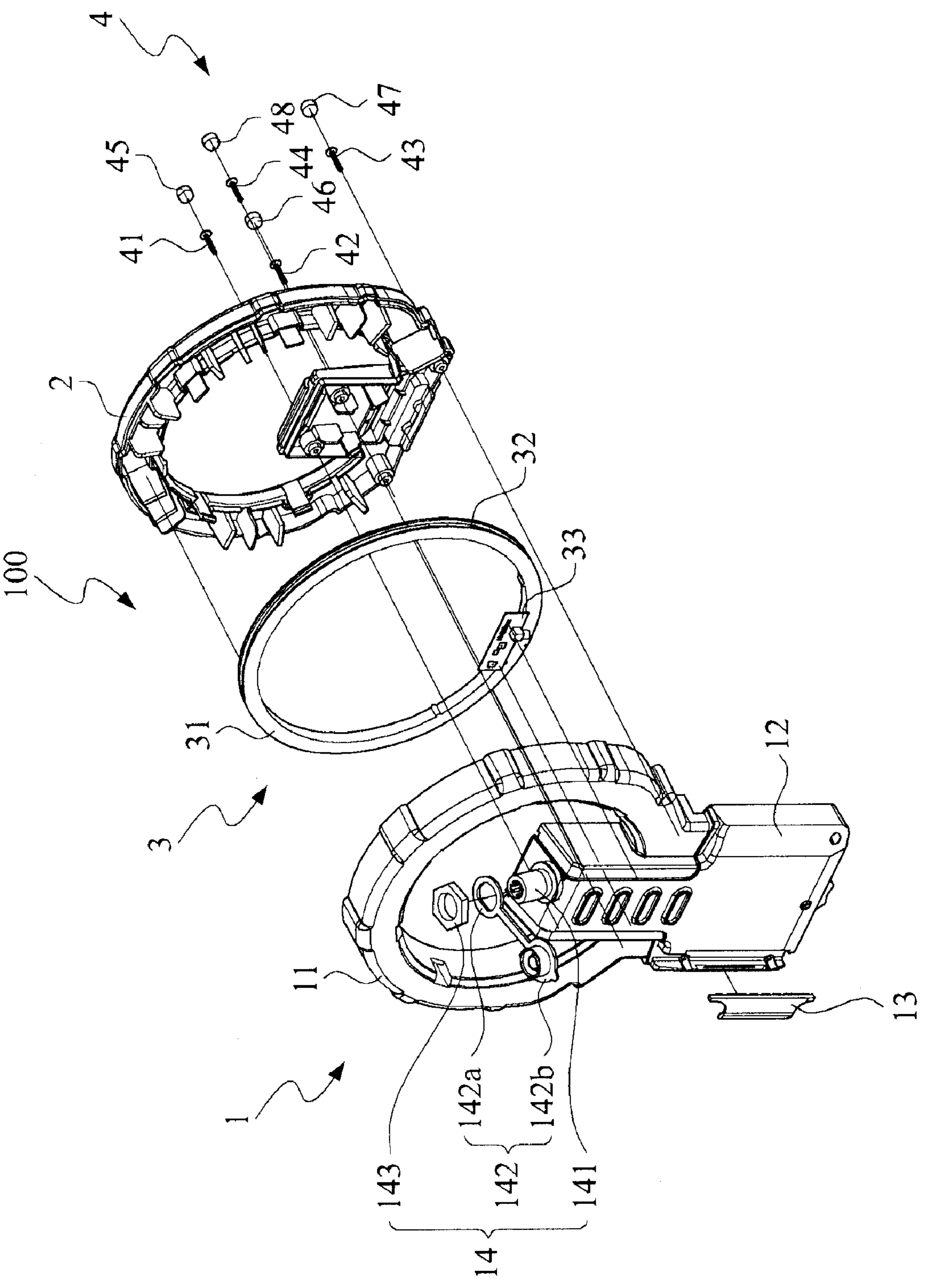
FIG. 1 illustrates inner components being assembled between two shells in a preferred embodiment of the present invention.
Figure 2:
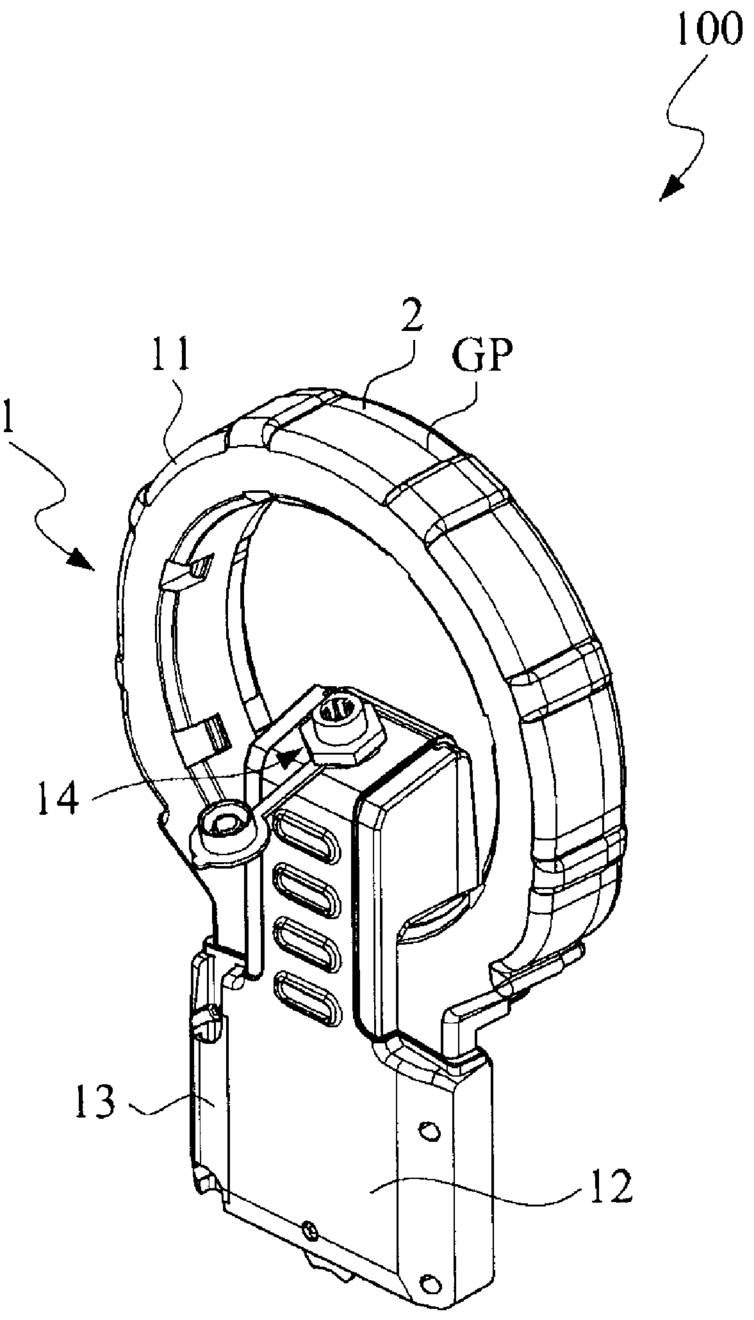
FIG. 2 illustrates a sub-assembly being made by assembling inner components and the two shells in the preferred embodiment of the present invention.

Please refer to FIG. 1 to FIG. 5, which present a series of steps for manufacturing a water-proof RFID sensing device. Among the drawings, FIG. 1 illustrates inner components being assembled between two shells in a preferred embodiment of the present invention; and FIG. 2 illustrates a sub-assembly being made by assembling inner components and the two shells in the preferred embodiment of the present invention. As shown in FIGS. 1 and 2, two water-proof shells 1 and 2 ("water-proof shell" hereinafter is simplified by "shell") are matched with each other, a sensing unit 3 is assembled between the shells 1 and 2, and a fixing accessory set 4 is applied to fix the shell 1 and 2 to form a sub-assembly 100.

The shell 1 comprises a upper portion 11, a lower portion 12, a water-proof cover 13 and a connection set 14. The lower portion 12 is extended from the upper portion and served as a gripping hand, which is also viewed as a first water-proof portion; the water-proof cover 13 is assembled to the lower portion; the connection set 14 comprises a connector 141, a connector protection member 142 and a nut 143. The connector 141 is applied to connect with the other extended member (s), such as an extension sensor, extension inductive antenna, water-proof transmission wire, and other accessories etc., so as to provide the additional function(s). The connector protection member 142 comprises a connection ring 142*a* and a water-proof connector cover 142*b*, the connection ring 142*a* is assembled on the peripheral of the connector 141, and the water-proof connector cover 142*b* is extended from the holding ring 142*a* and applied to cover the connector 141. The nut 143 is applied to be screwed to the peripheral of the connector 141 to fix the connection ring 142*a*.

The shell 2 matches the upper portion 11 of the shell 1, and comprises four assembling holes (not shown). The sensing unit 3 comprises a ring-shaped fixture 31, at least one set of induction coil 32, and an induction circuit board 33 with at least one induction circuit arranged thereon. The set of induction coil 32 is wound around the peripheral of the ring-shaped fixture 31, and the induction circuit board 33. The induction circuit board 33 is connected to the ring-shaped fixture 31, and the induction circuit arranged on the induction circuit board 33 is electrically connected with the set of induction coil 32.

The fixing accessory set 4 comprises four bolts 41, 42, 43, 44, four plugs 45, 46, 47 and 48. After assembling the sensing unit 3 between the shells 1 and 2, the bolts 41, 42, 43 and 44 are applied to perforate the assembling holes of the shell 2 and be screwed to the upper portion 11 of the shell 1, so as to fix the shells 1 and 2 together. The plugs 45, 46, 47 and 48 are respectively plugged into the assembling holes of the shells 2 after the bolts 41, 42, 43 and 44 are screwed to the upper portion 11 of the shell 1.

It is obvious that there is still existing at least one gap GP between the upper portion 11 of the shell 1 and the shells 2 after completing the steps of assembling the sub-assembly 100. Therefore, if the sub-assembly 100 now were directly served as a water proof RFID sensing device and operated under water or a humid environment condition, water will permeate through the gap GP between the upper portion 11 of the shell 1 and the shell 2 to make the inner components, such as the induction circuit arranged on the induction circuit board 33, be damaged or broken. Thus, in the sub-assembly 100, the part between the upper portion 11 of the shell 1 and the shell 2 can be view as a water-permeable portion, which is necessary to be further packaged to prevent water permeation.

Figure 3:
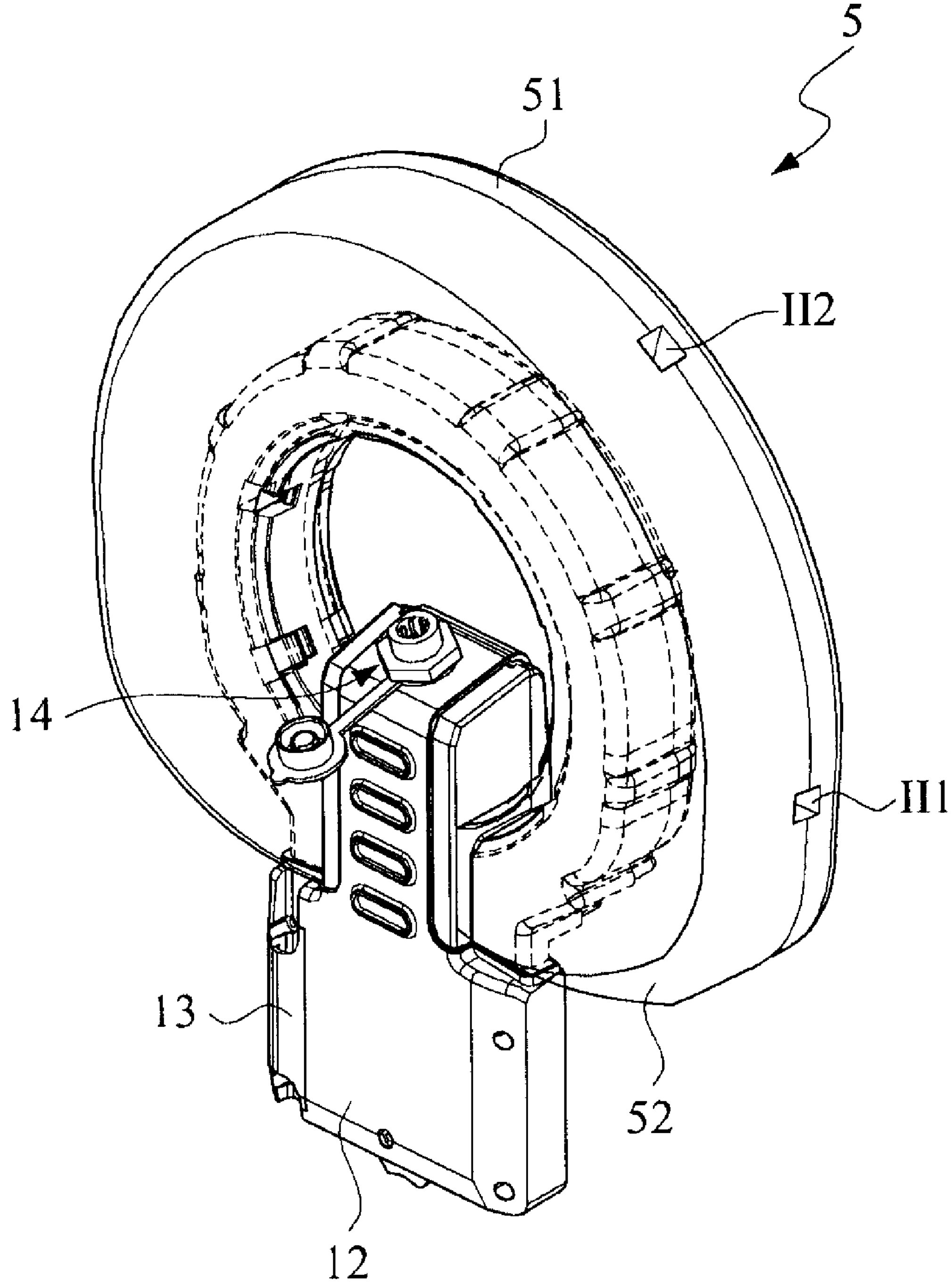
FIG. 3 illustrates an injection molding die being fitted around the water-permeable portion of the sub-assembly to execute an injection molding treatment in the preferred embodiment of the present invention.
Figure 4:
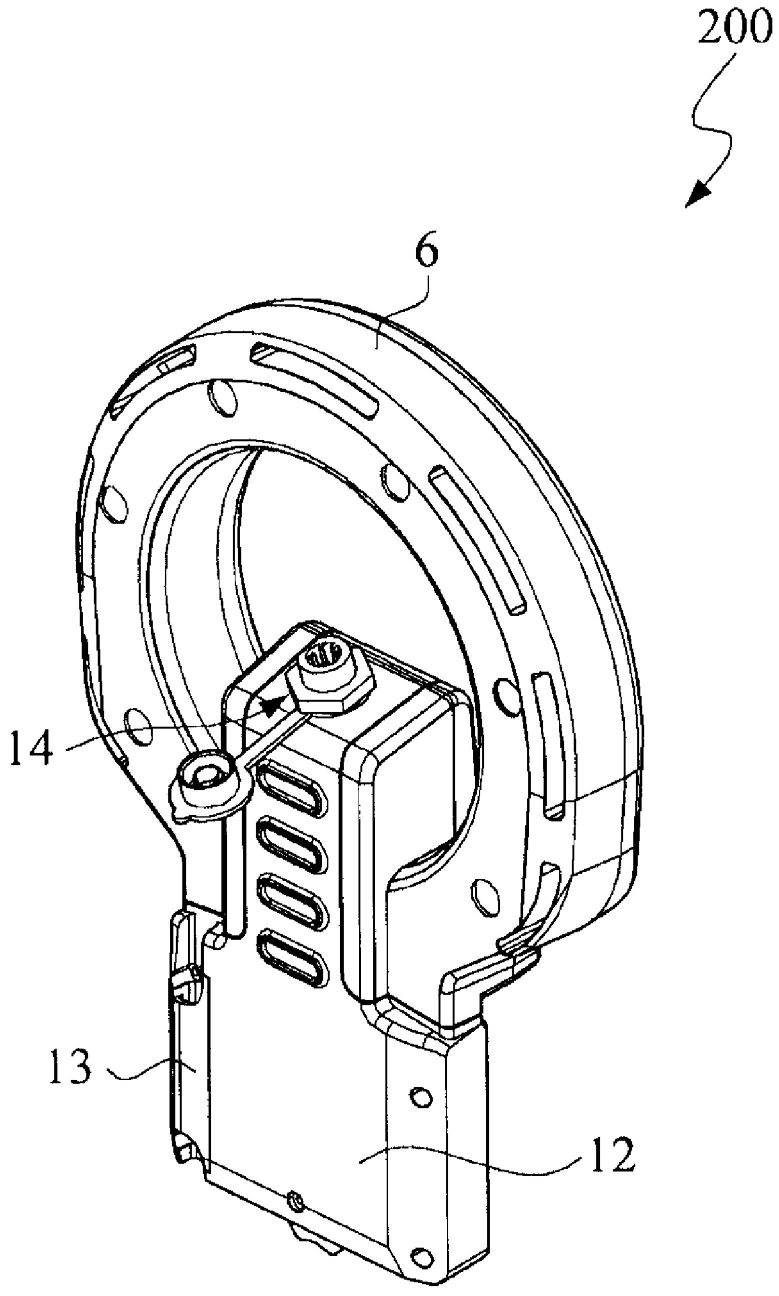
FIG. 4 illustrates the water-proof electronic device having the first water-proof portion and the second water-proof portion after a cooling process and removing the injection molding die in the preferred embodiment of the present invention.
Figure 5:
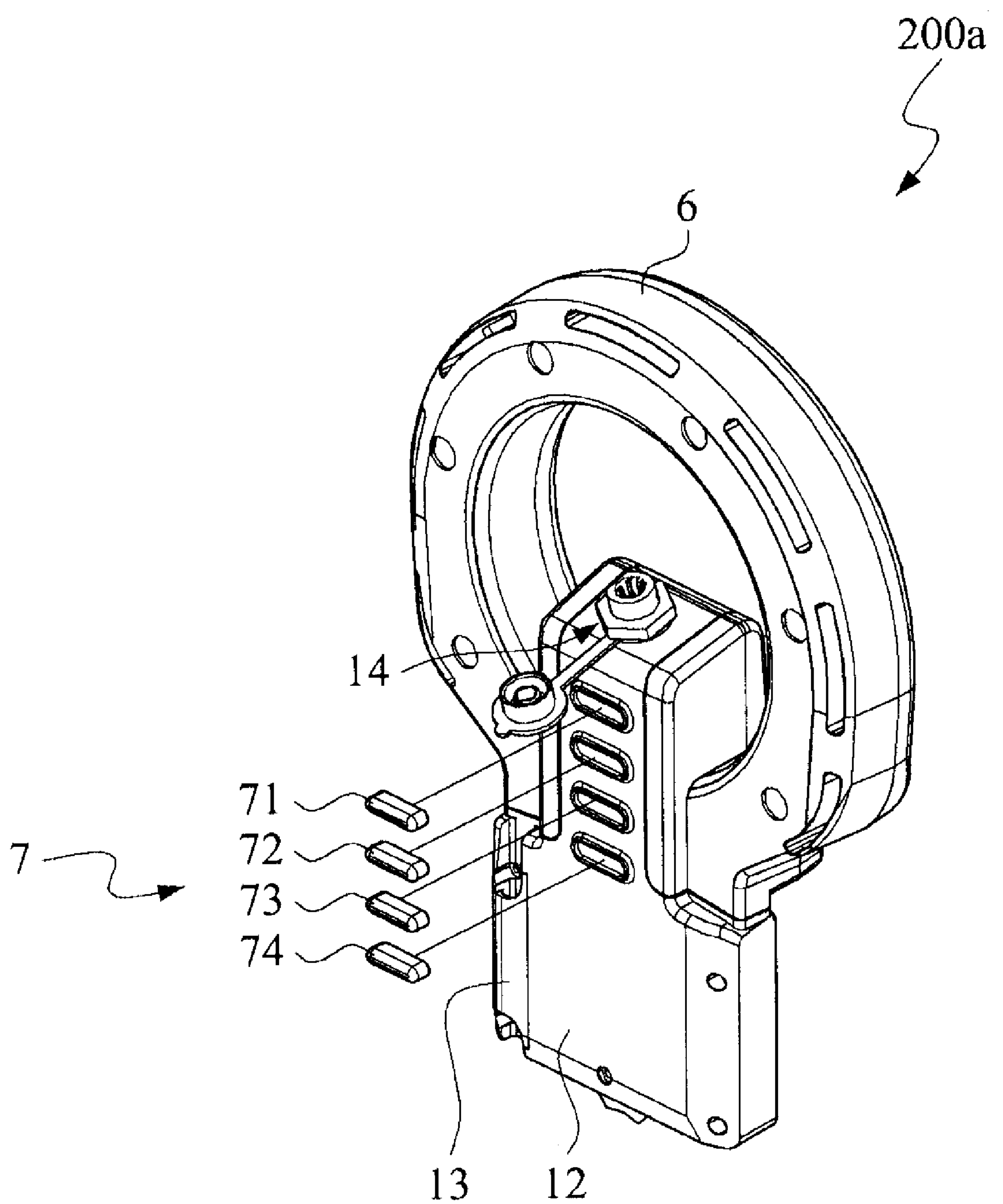
FIG. 5 illustrates that the water-proof electronic device can be further assembled with some impact-resistance members to provide the function of impact-resistance in an application of the preferred embodiment of the present invention.

Based on above statement, please further refer to FIG. 3 and FIG. 4, wherein FIG. 3 illustrates an injection molding die being fitted around the water-permeable portion of the sub-assembly to execute an injection molding treatment in the preferred embodiment of the present invention; and FIG. 4 illustrates the water-proof electronic device having the first water-proof portion and the second water-proof portion after a cooling process and removing the injection molding die in the preferred embodiment of the present invention. As shown in FIG. 3, for providing well packaging for the water-permeable portion, an injection molding die 5 is applied to execute an injection molding treatment for the water-permeable portion.

The injection molding die 5 comprises a first die 51 and a second die 52 matching to the first die 51. Before executing the injection molding treatment, the first die 51 and the second die 52 should be fitted around the water-permeable portion, i.e., the part between the upper portion 11 of the shell 1 and the shell 2. After fitting the first die 51 and the second die 52 around the water-permeable portion, a plurality of injection inlets, such as the injection inlets II1 AND II2, are existed between the first die 51 and the second die 52. Then, the injection molding treatment is executed within an injection molding machine (not shown).

After completing the injection molding treatment, it is necessary to execute a cooling process to cool the injection material between the injection molding die 5 and the water-permeable portion. After the cooling process, the first die 51 and the second die 52 can be removed, and a second water-proof portion 6 is form between the outer surface of water-permeable portion and injection molding die when the injection material is entirely solidified, as shown in FIG. 4. Up to now, a water-proof RFID sensing device 200 having the first water-proof portion (i.e., the lower portion 12 of the shell 1) and the second water-proof portion 6 in its appearance is manufactured.

Any person skilled in ordinary art can easily make out that the water-permeable portion has better to be made of a material with a melt temperature substantially greater than a working temperature of the injection molding treatment. Preferably, under the working temperature of the injection molding treatment, the surface of the water-permeable portion is slightly melted to be well connected with the second water-proof portion 6. Additionally, it is more important to control the parameter(s) of the injection molding, such as the pressure, the working temperature, the viscous coefficient of the melted injection material under the working temperature, etc., and further to go with the proper design of the injection inlets and runners, so that the second water-proof region 6 can perform well efficiency of water proof. In the embodiment of the present invention, it is suggested that the water-permeable portion can be mainly composed of polycarbonate (PC), and the second water-proof portion 6 (i.e. the injection material) can be mainly composed of thermoplastic Elastomer (TPE).

For making the water-proof RFID sensing device 200 have additional functions, some outer components can be further assembled to the appearance of the water-proof RFID sensing device 200, either the first water-proof portion (i.e., the lower portion 12 of the shell 1) or the second water-proof portion 6. Please refer to FIG. 5, in an application of the preferred embodiment of the present invention, an impact-resistance set 7 is assembled to the lower portion 12 of the shell 1 to make another water-proof RFID sensing device 200*a*, and the impact-resistance set 7 comprises four impact-resistance members 71, 72, 73 and 74, which can be made of rubber or other material capable of absorbing impact energy.

Figure 6:
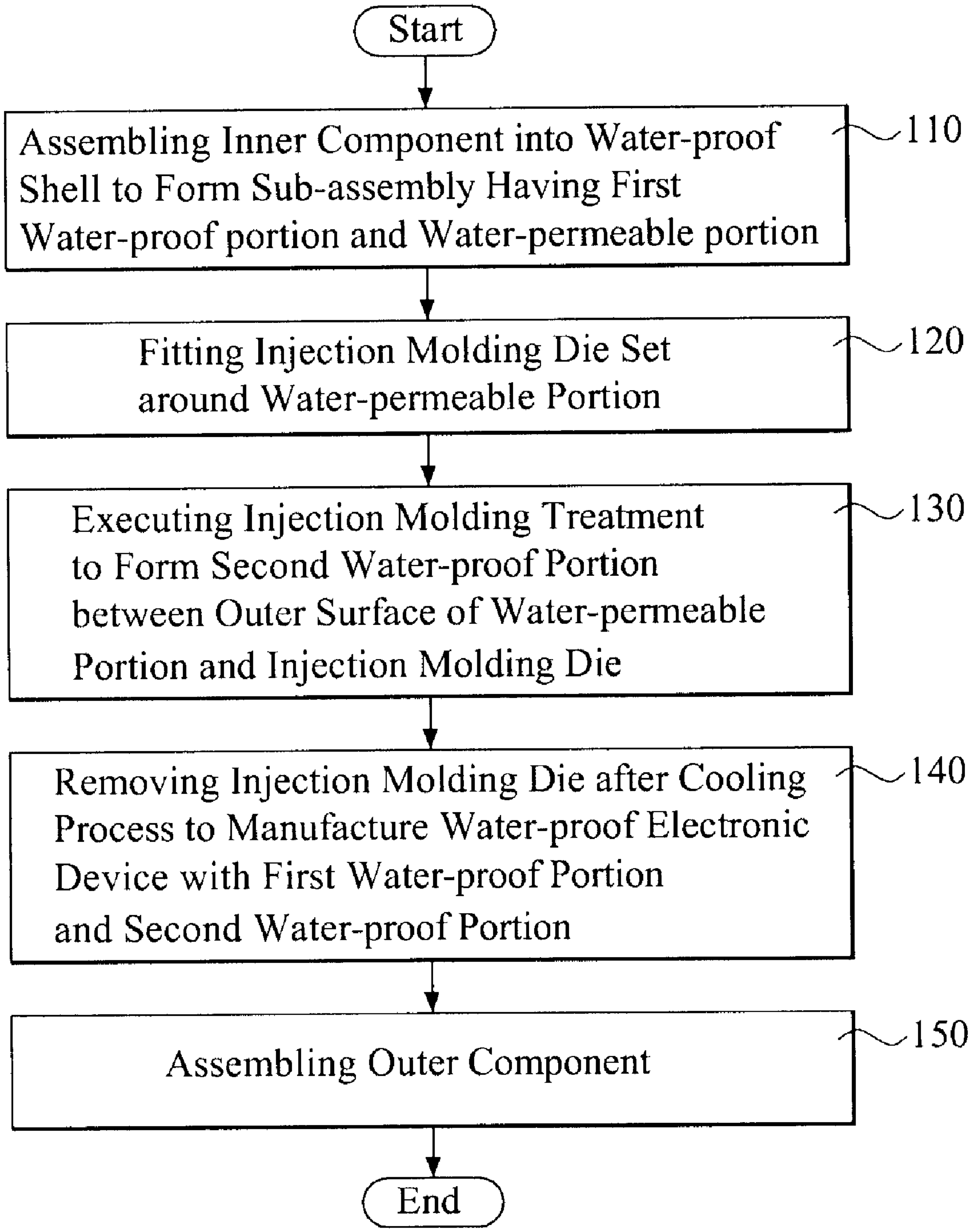
FIG. 6 is a simplified flowchart presenting the simplified steps of the method for manufacturing the water-proof electronic device in the preferred embodiment of the present invention.

Finally, for the purpose of making persons skilled ordinary art memorize the steps of the present invention more easily, a simplified flowchart will be provided to summarize the technology as disclosed above. Please refer to FIG. 6, which is a simplified flowchart presenting the simplified steps of the method for manufacturing the water-proof electronic device in the preferred embodiment of the present invention. As shown in FIG. 6, for executing the present invention, it is necessary to assemble the inner component(s) into water-proof shell to form sub-assembly having first water-proof portion (the lower portion 12 of the shell 1) and water-permeable portion (the part between the upper portion 11 of the shell 1 and the shell 2, step 110), and fit the injection molding die 5 around water-permeable portion (step 120).

Following up, it is necessary to execute the injection molding treatment to form second water-proof portion 6 between outer surface of water-permeable portion and the injection molding die 5 (step 130). After a cooling process, it is necessary to remove the injection molding die 5 to manufacture the water-proof electronic device with first water-proof portion and second water-proof portion (such as the water-proof RFID sensing device 200, step 140). If necessary, it is able to assemble outer components, such as the impact-resistance members 71, 72, 73 and 74, to make another water-proof electronic device, such as the water-proof RFID sensing device 200*a*, have additional function (step 150).

After reading above description, it is believable that any person skilled in ordinary arts can easily realize that in the present invention, the inner components, such as the set of induction coil 32 and the induction circuit board 33 with at least one induction circuit arranged thereon, are assembled within the water-permeable portion of the sub-assembly 100, and the water-permeable portion is further integrally packaged via the injection molding treatment to form the second water-proof portion 6; therefore, there will be no gap on the second water-proof portion 6 any more; hence, the inner components can be well packaged to prevent from contacting with water when the water-proof electronic device 200 is operated under water or the humid environment condition. Additionally, due to that the water-permeable portion is further integrally packaged via the injection molding treatment to form the second water-proof portion 6, the overall appearance will be more exquisite under visual observation.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method being applied to manufacture a water-proof electronic device comprising the steps of:

(a) assembling at least one inner component into at least one water-proof shell to form at least one sub-assembly having a first water-proof portion and a water-permeable portion;

(b) fitting an injection molding die around the water-permeable portion;

(c) executing an injection molding treatment for the injection molding die with the water-permeable portion therein to form a second water-proof portion of the water-proof electronic device between the outer surface of the water-permeable portion and the injection molding die; and (d) Removing the injection molding die after a cool process to manufacture the water-proof electronic device with the first water-proof portion and the second water-proof portion.

2. The method as claimed in claim 1, wherein the inner component is at least one electronic component.

3. The method as claimed in claim 1, wherein the water-proof electronic device is a water-proof radio frequency identification (RFID) sensing device.

4. The method as claimed in claim 3, wherein the first water-proof portion is a gripping handle of the water-proof RFID sensing device.

5. The method as claimed in claim 3, wherein the inner component is at least one sensing unit of the water-proof RFID sensing device.

6. The method as claimed in claim 5, wherein the sensing unit comprises at least one set of induction coil.

7. The method as claimed in claim 5, wherein the sensing unit comprises at least one induction circuit.

8. The method as claimed in claim 1, further comprising a step (e) of assembling at least one outer component.

9. The method as claimed in claim 8, wherein the inner component is at least one electronic component.

10. The method as claimed in claim 8, wherein the water-proof electronic device is a water-proof radio frequency identification (RFID) sensing device.

11. The method as claimed in claim 10, wherein the first water-proof portion is a gripping handle of the water-proof RFID sensing device.

12. The method as claimed in claim 10, wherein the inner component is at least one sensing unit of the water-proof RFID sensing device.

13. The method as claimed in claim 12, wherein the sensing unit comprises at least one set of induction coil.

14. The method as claimed in claim 12, wherein the sensing unit comprises at least one induction circuit.

15. The method as claimed in claim 8, wherein the outer component is at least one impact-resistance member.

16. The method as claimed in claim 1, wherein the water-permeable portion is made of a material with a melt temperature substantially greater than a working temperature of the injection molding treatment.

* * * * *